United States Patent [19]

Esser et al.

[11] Patent Number: 6,041,850
[45] Date of Patent: Mar. 28, 2000

[54] TEMPERATURE CONTROL OF ELECTRONIC COMPONENTS

[75] Inventors: Albert Andreas Maria Esser; James Patrick Lyons, both of Niskayuna, N.Y.; Lyle Thomas Keister, Daleville, Va.; Steven Wade Sutherland, Salem, Va.; Melvin La Vern Hughes, Troutville, Va.; Howard Ross Edmunds, Roanoke, Va.; Stephen Daniel Nash, Salem, Va.; Paul Stephen Pate, Troutville, Va.; Patrick Henry McGinn, Boones Mill, Va.; Conrad Angelo Pecile, Roanoke, Va.

[73] Assignee: General Electric Company, Schenectady, N.Y.

[21] Appl. No.: 08/747,710

[22] Filed: Nov. 12, 1996

Related U.S. Application Data

[60] Provisional application No. 60/022,673, Jul. 26, 1996.

[51] Int. Cl.[7] .................................................... F28D 15/00
[52] U.S. Cl. ............................. 165/104.33; 165/104.26; 165/80.4; 361/702; 174/15.2
[58] Field of Search ............................ 165/122, 104.14, 165/104.34, 104.33, 104.26, 80.4; 361/700, 702, 707; 174/15.2; 257/715, 720

[56] References Cited

U.S. PATENT DOCUMENTS

| | | | |
|---|---|---|---|
| 1,750,750 | 3/1930 | Gay | 165/104.14 |
| 1,821,509 | 9/1931 | Gay | 165/104.14 |
| 3,174,540 | 3/1965 | Dutton | 165/104.14 |
| 3,572,426 | 3/1971 | Edwards | 165/104.14 |
| 4,226,282 | 10/1980 | Kunsagi et al. | 165/104.14 |
| 5,237,338 | 8/1993 | Stephenson | 346/76 PH |
| 5,253,702 | 10/1993 | Davidson | 165/80.4 |
| 5,289,869 | 3/1994 | Klein | 165/32 |
| 5,331,510 | 7/1994 | Ouchi | 361/702 |
| 5,339,214 | 8/1994 | Nelson | 361/695 |
| 5,358,799 | 10/1994 | Gardner | 429/26 |
| 5,491,610 | 2/1996 | Mok et al. | 361/695 |
| 5,504,650 | 4/1996 | Katsui | 361/697 |
| 5,651,411 | 7/1997 | Suzuki | 165/104.33 |
| 5,695,004 | 12/1997 | Beckwith | 165/104.14 |

FOREIGN PATENT DOCUMENTS

| | | |
|---|---|---|
| 97305322 | 10/1998 | European Pat. Off. . |
| 4108981 A1 | 10/1992 | Germany . |

OTHER PUBLICATIONS

"Heat Pipe Science and Technology" By A. Faghri, ISBN 1–56032–383–3, 1995, pp. 44–47 and 493–499.

"An Introduction to Heat Pipes Modeling, Testing and Applications" By GP Peterson, ISBM 0–471–30512–X, 1994, pp. 12–13 and 285–322.

*Primary Examiner*—Ira S. Lazarus
*Assistant Examiner*—Terrell McKinnon
*Attorney, Agent, or Firm*—Ann M. Agosti; Jill M. Breedlove

[57] ABSTRACT

A system for temperature control of an electronic component includes a heat plate supporting the component; a heat plate temperature sensor; a fan capable of providing air for cooling the heat plate; and a fan control for using the heat plate temperature to control the operation of the fan to provide a substantially constant heat plate temperature. The system can further include a heat pipe assembly having fins and coupled to the heat plate with the fan capable of providing air to the fins. The heat pipe assembly can include at least two heat pipes each having first ends coupled to the heat plate and second ends situated in a condensation section where at least one of the heat pipes has a different working fluid than an other. A switch temperature or load current sensor can be coupled to the heat plate and supply data to a switch controller for receiving the switch temperature, determining whether the temperature or load current has changed, and adjusting a switching frequency of the at least one electronic switch device in response to any change of the switch temperature. A bus layer can be situated adjacent the component and selectively coated with an insulating material and studs can mechanically and electrically coupling the bus layer and a printed circuit board to the component. An insulating shield can be situated between the bus layer and the printed circuit board with the studs.

5 Claims, 5 Drawing Sheets

TEMPERATURE CONTROL OF ELECTRONIC COMPONENTS

This application claims the benefit of U.S. Provisional Application No 60/022,673 filed Jul. 26, 1996.

BACKGROUND OF THE INVENTION

The reliability and lifetime of machines using electronic components such as semiconductor devices can be increased by reducing the temperature variations imposed on the electronic components during operation. Therefore, electronic components often require a heat transfer device for cooling during normal operation. Heat exchangers have been used to transfer heat away from electronic components. A heat pipe, for example, thermally connects electronic components to the environmental ambient air with a low thermal resistance.

The elements of a heat pipe are a sealed container (pipe and end caps), a wick structure, and a small amount of working fluid which is in equilibrium with its own vapor. The length of the heat pipe is divided into three parts: evaporator section, adiabatic (transport) section, and condenser section. A heat pipe can have multiple heat sources or sinks with or without adiabatic sections depending on specific applications and design. Heat applied to the evaporator section by an external source is conducted through the pipe wall and wick structure where it vaporizes the working fluid. The resulting vapor pressure drives the vapor through the adiabatic section to the condenser, where the vapor condenses, releasing its latent heat of vaporization to the provided heat sink. Capillary pressure created by menisci in the wick pumps the condensed fluid back to the evaporator section.

During cold weather operation, such as at temperatures below zero degrees Celsius, a heat pipe can become nonfunctional when the working fluid freezes inside the condenser section of the heat pipe and causes an unacceptable rise in the thermal impedance of the heat pipe.

SUMMARY OF THE INVENTION

It would be desirable to permit a heat pipe with a working fluid such as water to remain operational below the freezing point of the working fluid.

It would also be desirable to more efficiently provide temperature control of electronic components.

In one embodiment, a variable speed fan is used to control the amount of air flow through the condenser areas of a heat exchanger by sensing the base plate temperature and adjusting the air flow rate using a control algorithm.

In another embodiment, a combination of a variable speed fan and a variable conductance heat pipe is used for temperature control with the variable conductance heat pipe providing a quick adjustment for impulse loads and the variable speed fan providing a slower response for responding to changes in average injected heat levels.

In another embodiment, a constant rate of power loss in an electronic switch device is generated by controlling the switching frequency. The switching frequency is inversely proportional to the load current (and switch temperature). Increasing the switching frequency produces more switching losses and can compensate for lower conduction losses during lower current flow with the total losses being responsible for the temperature of an electronic component. This embodiment provides a quick response in exchange for efficiency reductions.

In another embodiment, when an environmental ambient air temperature is low, a front row of heat pipes has a different working fluid than the following row or rows of heat pipes and is used to add heat to passing air and thus raise the local ambient air temperature for the following row or rows.

In another embodiment, a system for temperature control of at least one electronic component comprises a heat plate supporting the at least one electronic component; a bus layer situated adjacent the heat plate, the bus layer selectively coated with an epoxy; a printed circuit board layer; and studs for mechanically and electrically coupling the bus layer and the printed circuit board to the at least one electronic component. The system may further include an insulating shield situated between the bus layer and the printed circuit board.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF PREFERRED EMBODIMENTS OF THE INVENTION

Figure 1:
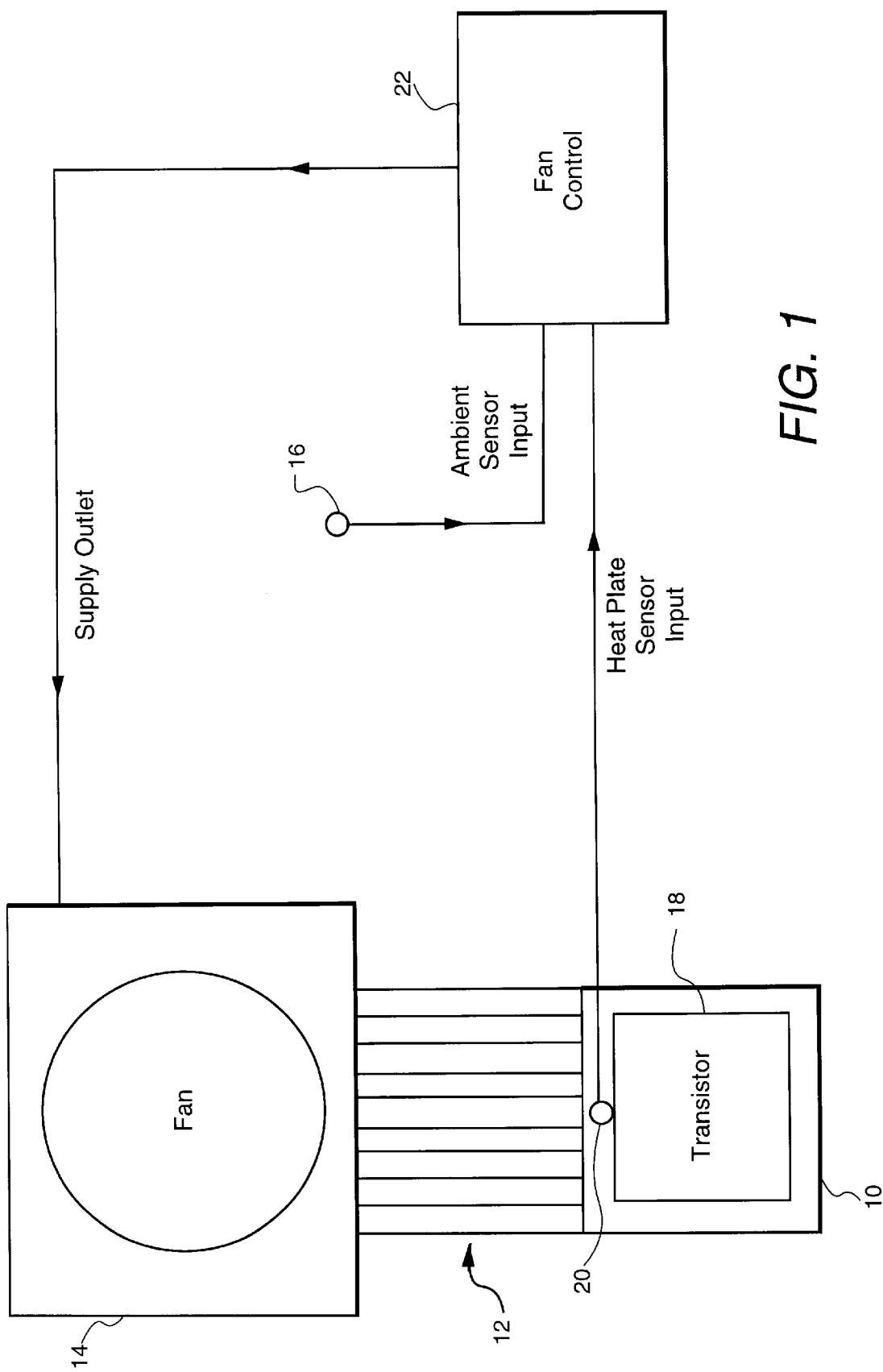
FIG. 1 is a block diagram of a temperature control system of the present invention.

FIG. 1 is a block diagram of a temperature control system of the present invention which can be used as a heat exchanger to stabilize the temperature of a heat plate 10 and thus an electronic component (shown as a transistor 18). A fan control 22 is used to control operation of a fan 14 which in one embodiment comprises a variable speed fan.

A temperature sensor 20 on heat plate 10 provides a heat plate temperature. Heat plate temperature sensors have been used in conventional designs to determine when to turn off power to an electronic component. In the present invention, the temperature sensor is instead used to determine the appropriate fan speed for a heat pipe.

The fan control determines whether the heat plate temperature has changed and adjusts the speed of the fan to compensate for the change in temperature to hold the plate temperature substantially constant. If the fan is a one speed fan, than the fan speed is "adjusted" by turning the fan on or off. If the fan is a variable speed fan, the fan can have a speed of zero (fan off) or a range of speeds within the fan's capability. If the heat plate temperature is too high and the fan is already at its maximum speed or if the heat plate temperature is too low and the fan is already at its minimum speed (off), then the temperature variation cannot be compensated.

The fan is a unit which may comprise a single rotating blade or a plurality of rotating blades. If a plurality of blades or individual fans are used in a fan, the total "speed" of the fan can be further adjusted, if desired, by changing the number of blades that are rotating.

In one embodiment, an ambient temperature sensor 16 can provide an initial ambient temperature, and the fan control, which may comprise a computer, for example, can convert the initial ambient temperature to a reference temperature which is at a value above the initial ambient temperature. The value is set to less than or equal to the maximum expected rise of the heat exchanger. Generally the expected highest rise is approximately 30° C. above the initial ambient temperature. In an embodiment wherein single speed (on or off) fan is used, the expected highest rise in one embodiment is about 10° C. The control system compares the heat plate temperature with the reference temperature and generates an error signal when the plate temperature begins to rise or fall beyond the reference temperature. An error signal causes the fan speed to increase or decrease to hold the plate temperature nearly constant by driving it towards the reference temperature.

For a variable speed fan, the fan control will vary an output signal, either in voltage or frequency depending if an AC or DC fan is used, to change the speed of the fan and drive the error signal towards zero. The system is especially useful for cyclic loading because it will strive to maintain a constant heat plate temperature over varying loads.

In one embodiment, initial ambient temperature is not sensed, and instead the reference temperature is selected to be at the highest expected ambient temperature plus a predetermined rise value.

When an electronic component such as an insulated gate bipolar junction transistor (IGBT) is used, one of the failure modes is the solder bond fatigue between a ceramic material and a copper base plate. With the present control scheme, the temperature excursions of the base plate are minimized and an extended lifetime of the device is achieved. By providing an initial ambient sensor the reference temperature will vary such that the total temperature excursion the IGBT base plate experiences is independent of changes in ambient temperature.

In another embodiment, a combination of a variable speed fan and a heat pipe 12 can be used for temperature control. When a variable conductance heat pipe is used it can provide a quick adjustment for impulse loads and the variable speed fan can provide a slower response to changes in average injected heat levels. In this embodiment the fan would be positioned, as shown in FIG. 1, to provide air flow to the heat pipe.

Figure 2:
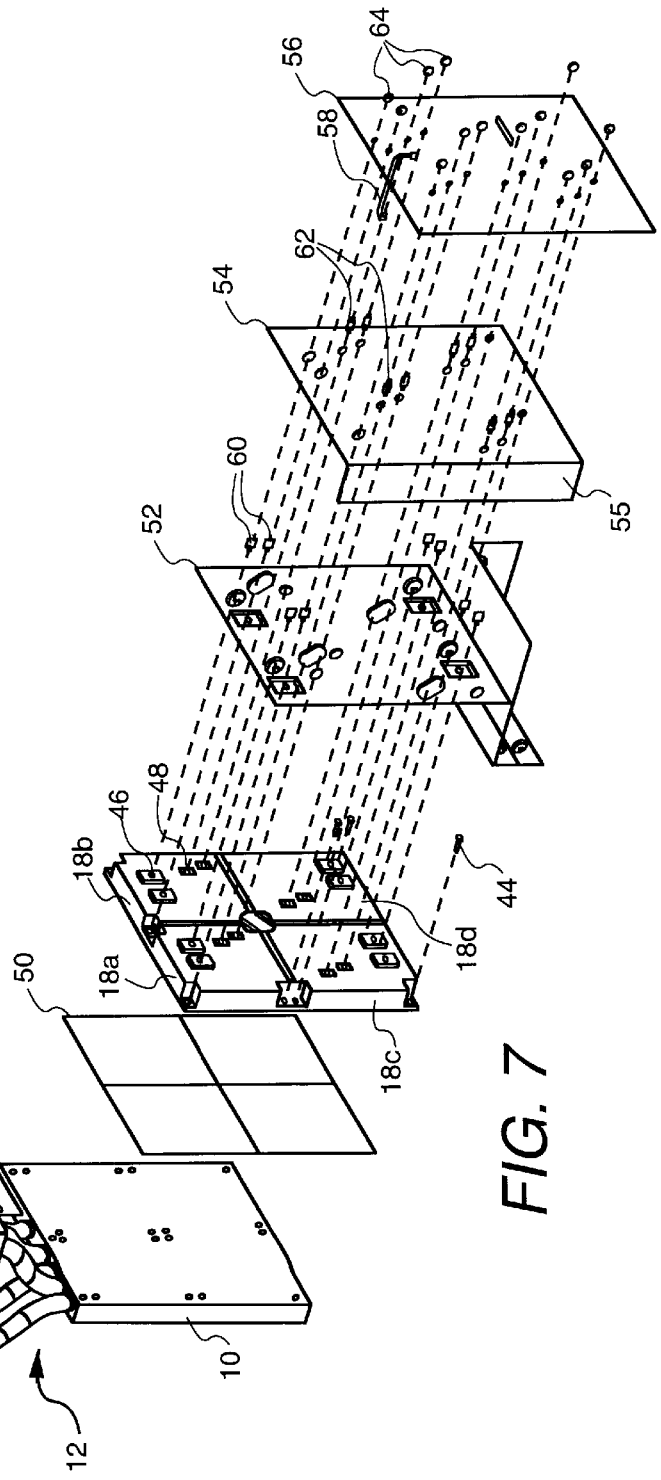
FIG. 2 is a block diagram of another temperature control system of the present invention.
Figure 2:
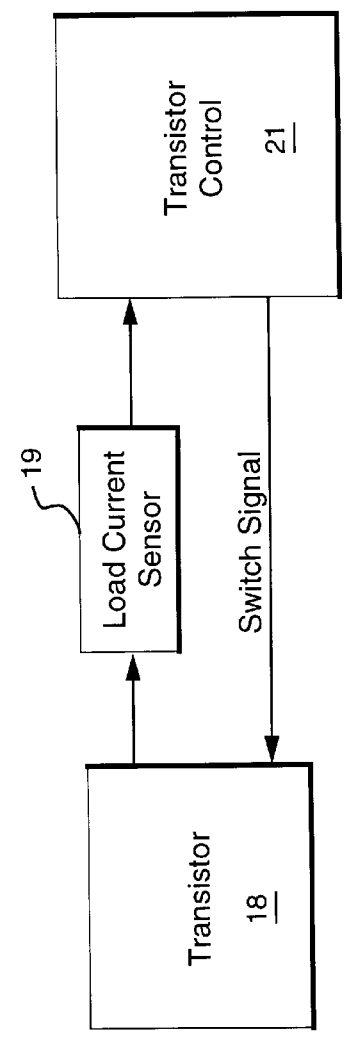

FIG. 2 is a block diagram of another temperature control system of the present invention. Power loss in an electronic switch device such as transistor 18 is the sum of conduction loss and switch loss. For electronic applications, it is important to keep heat (and thus the rate of power loss) substantially constant.

Load current (which can be measured by a load current sensor 19) is a factor of conduction losses, whereas switch frequency is a factor of switch losses. Therefore, changes in load current can be compensated by using a switch control, which may comprise a computer, for example, and which is shown as transistor control 21. The switch control is capable of creating inversely proportional changes in switching frequency in response to load current changes and thus maintaining a substantially constant power loss rate. Increasing the switching frequency produces more switching losses and can compensate for lower conduction losses during lower current flow with the total losses being responsible for the temperature of an electronic component.

In another embodiment wherein no load current sensor is present, a temperature sensed by heat plate temperature sensor 20 of FIG. 1 can be used by transistor control 21 of FIG. 2 to control the switching frequency. If the transistor temperature increases, the switching frequency can correspondingly decrease, and if the transistor temperature decreases, the switching frequency can correspondingly increase.

As discussed above with respect to a fan control, for the switch control embodiment of FIG. 2, an ambient temperature sensor (shown in FIG. 1) can provide an initial ambient temperature which can be converted to a reference temperature for comparison with heat plate temperature or a reference temperature can be predetermined. The switching frequency can then be adjusted to drive the transistor temperature towards the reference temperature and thereby maintain a substantially constant transistor temperature over varying loads.

Figure 3:
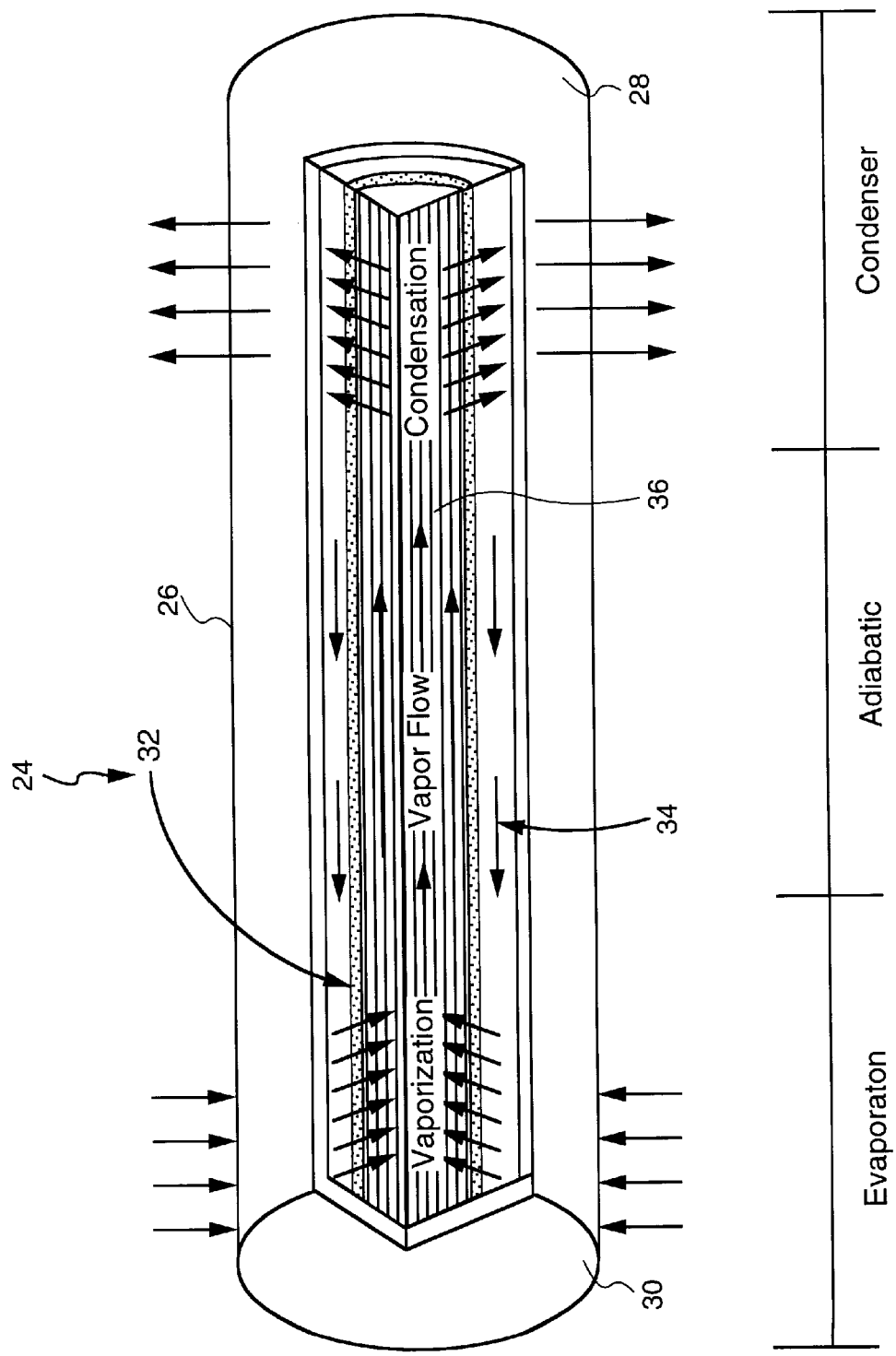
FIG. 3 is a sectional view of a conventional heat pipe.

FIG. 3 is a sectional view of a conventional heat pipe 24 illustrating a pipe container 26, end caps 28 and 30, a wick structure 32, working fluid 34, and vapor region 36. Heat is applied by the electronic component during operation in an evaporator section and conducted through the pipe container and wick structure where it vaporizes the working fluid. Vapor pressure drives the vapor through the adiabatic section to the condenser.

Figure 4:
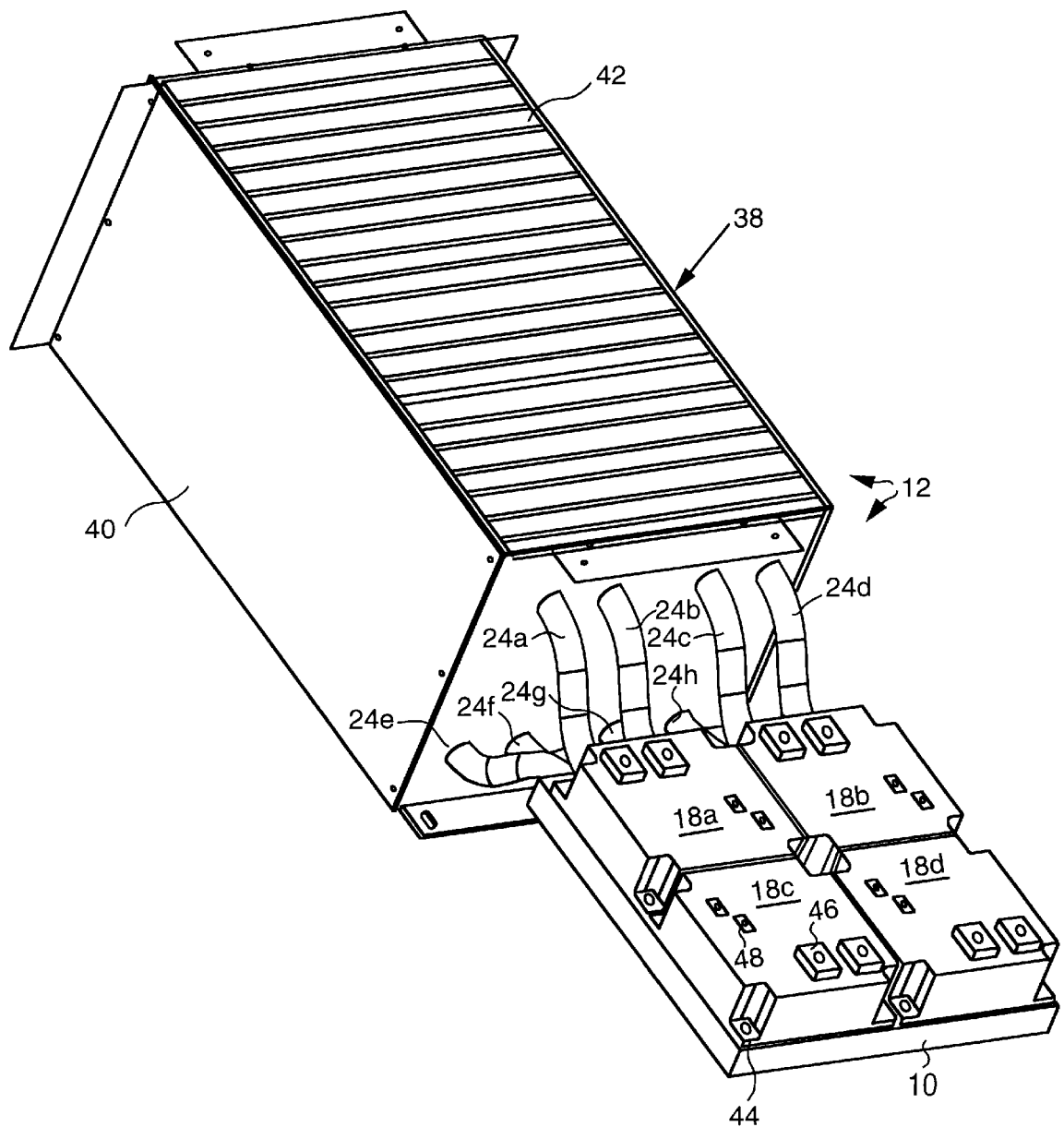
FIG. 4 is a perspective view of a heat pipe array embodiment of the present invention.
Figure 5:
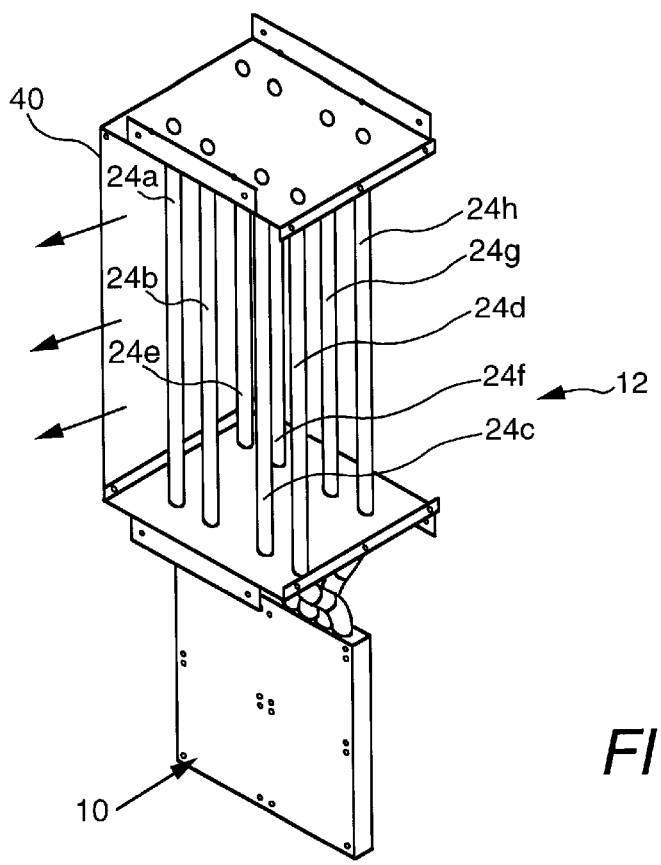
FIG. 5 is a view similar to that of FIG. 4 illustrating the embodiment without fins.

FIG. 4 is a perspective view of a heat pipe array 12 embodiment of the present invention, and FIG. 5 is a view similar to that of FIG. 4 illustrating the embodiment without fins for ease of visibility. In the condenser section a fin assembly 38 includes a housing 40, fins 42, and portions of heat pipes 24a, 24b, 24c, 24d, 24e, 24f, 24g, and 24h (24a–24h). The heat pipes are also coupled into a heat plate 10 which includes electronic components shown, for example, as transformers 18a, 18b, 18c, and 18d having input/output pads 46 and gate/emitter wiring connections 48 and being attached to the heat plate by screws 44.

In the present invention, the fin assembly 38 section is designed with a front row of heat pipes 24a, 24b, 24c, and 24d that add heat to the passing air and thus raise the local ambient air temperature for the following row of heat pipes 24e, 24f, 24g, and 24h. Although multiples rows of heat pipes have been used in conventional applications to increase fin efficiency, none have been used for temperature compensation purposes.

By configuring bent sintered powdered wick heat pipes in the heat exchanger's construction, heat flux can transfer from a single plane evaporator (plate 10) to a multi-plane condenser (fin assembly 38). The heat pipes can be bent by a tooling fixture for uniformity, if desired. In one embodiment, the fins have increased efficiency by widening the spacing between heat pipe rows to a distance of at least two pipe diameters. Increasing the distance between heat pipe rows, however, requires a corresponding increase in the length and/or angle of the heat pipe bends.

The multi-plane condenser section allows the upstream heat pipes (those heat pipes physically situated closer to the intake of fan air) to raise the local ambient temperature for the downstream rows of heat pipes and thus allow the unit to remain operational in environments below zero degrees Celsius at the expense of producing a higher thermal impedance for total heat flux. When different working fluids are used in each respective row of heat pipes, a lower environment air temperature can be sustained with the unit remaining operational. The lower freezing point working fluid should operate upstream of the higher freezing point working fluid. In one embodiment, methanol (the lower freezing point working fluid) is used on the upstream row of heat pipes and water is used in the remaining heat pipes. This embodiment is advantageous because it permits use of readily available water as the working fluid in the downstream heat pipes.

The implementation of AC or DC voltage fans can be used to produce the positive cooling flow required and enhance the cold ambient operation of the heat pipe heat exchanger by controlling the cooling liquid flow rate with respect to evaporator plate temperature and the environment's ambient temperature.

The amount of heat the exchanger can release into the air depends on the amount of air volume passing over the fins. If, during cold temperatures, the air volume is reduced (the fan is slowed down), the heat produced by the semiconductor can be significant enough to thaw the pipes and keep the pipes from re-freezing. In one embodiment, the fans are not run when the plate temperature is below 0° C., and therefor the plate temperature remains near 0° C. if the external air temperature is colder.

Figure 6:
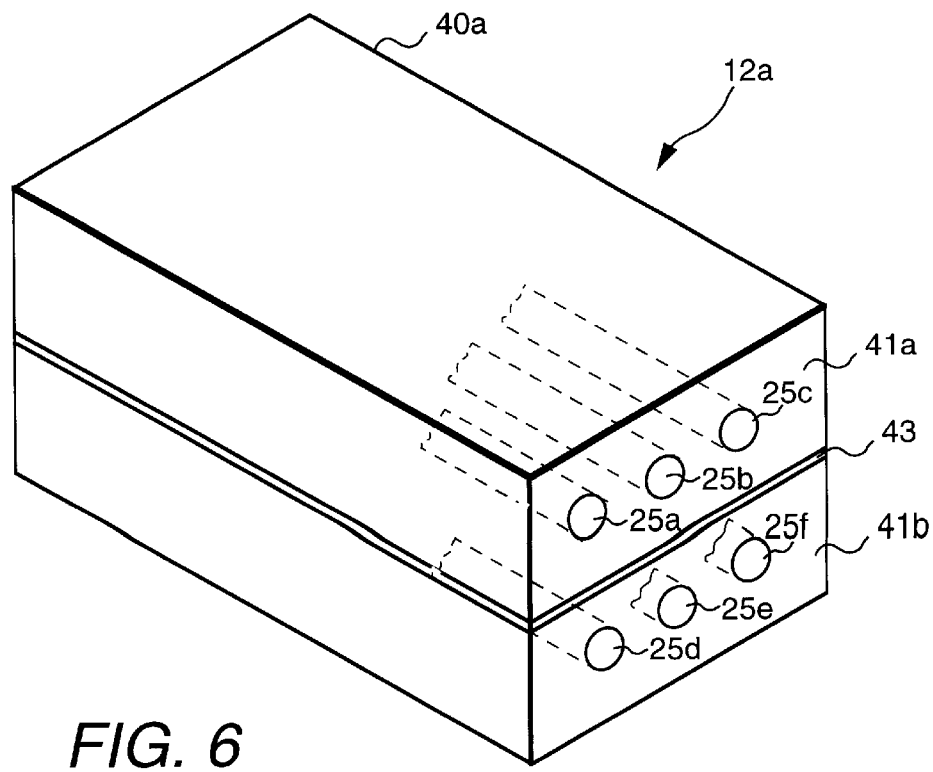
FIG. 6 is a partial perspective view of another heat pipe array embodiment of the present invention.

FIG. 6 is a partial perspective view of another heat pipe array embodiment of the present invention. Although the heat pipes have been shown and discussed as including fins in the condensation sections, other types of condensation sections can be used with the present invention as shown in FIG. 6 wherein condensation sections of a heat pipe array 12a are surrounded by a housing 40a for a liquid (or liquids) such as water which is circulated around the heat pipes 24a, 25b, 25c, 25d, and 25e for absorbing and dissipating heat. If desired, the liquid can be heated for cold operating conditions. In one embodiment, as shown, different liquids 41a and 41b having different freezing temperatures can surround different rows of pipes. In the embodiment of FIG. 6, a divider 43 is used to separate the two different liquids.

Figure 7:
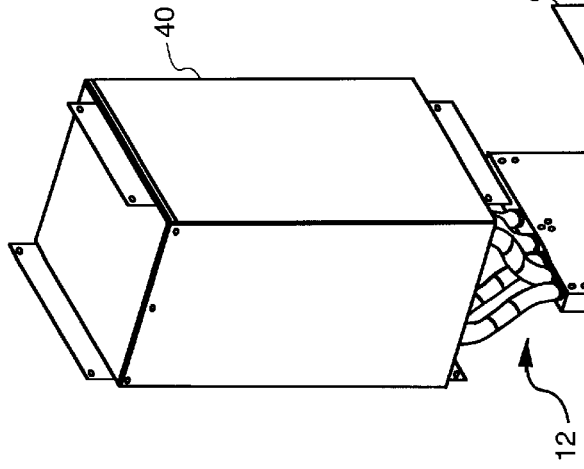
FIG. 7 is an expanded perspective view of a coated bus design of the present invention.

FIG. 7 is an expanded perspective view of a coated bus design of the present invention. In conventional electric drive system designs, bus layers overlying electronic components have several laminated insulating layers sandwiched thereon which can create the need for additional joints in the bus layer and require more space.

In the present invention, a bus layer, shown as bus layer 52, is coated with an insulating material. In one embodiment, the insulating material comprises a thermosetting plastic material such as an epoxy which can be applied by masking predetermined portions of the bus where electrical connections are desired, coating the bus with the epoxy by a technique such as spraying or brushing, and removing the mask material to expose the predetermined portions. A grease 50 such as a silicone grease can be present between transistors 18a, 18b, 18c, and 18d and heat plate 10.

Although optional, an insulating shield 54 comprising a material such as a plastic is useful for insertion between bus layer 52 and a printed circuit board 56 which serves as the gate driver for transistors 18a, 18b, 18c, and 18d. In one embodiment, shield 54 comprises LEXAN™ polycarbonate (LEXAN is a trademark of General Electric Co.) and includes a flange 55. The shield is useful in the event of a malfunction, for example. If a transistor explodes, the flange will help contain left-right vibrations and the main portion of the shield will create a more even force across the circuit board.

Studs 60 are present between bus layer 52 and shield 54, and studs 62 are present between shield 54 and printed circuit board 56. The studs comprise a material such as stainless steel, for example, and can be used both to physically hold the layers together and to form electrical interconnections between transistors, the bus layer, and the printed circuit board. The connection to the printed circuit board can be more firmly established by using nuts 64 to create a pressure on studs 62 and maintain electrical contact. A transducer 58 can be used as the heat plate temperature sensor.

The embodiment of FIG. 7 is useful for reducing required design time of the electronic component package. The electrical independence of air cooling system and the electrical system permits component layout optimization and shorter distances (bus bars) between electrical components which result in a lower inductance bus (which reduces the need for snubbers), less support insulator requirements, and direct bus bar paths which result in less mechanical and electrical connections between components. Independence of the thermal and electrical systems is also desirable for providing freedom to reduce the required spacing between electrical components such as transistors, bus capacitors, current sensors, and transistor drivers, for example. The heat pipe can be manufactured to tight tolerances, and the precision of its construction permits the bus bar design to be simplified. Studs 60 and 62 connect the printed circuit board, bus, and power components and eliminate the errors associated with wiring.

Variation of part location adds difficulty in bus bar design to insure good electrical connections. In the present invention, an electrical component (transistor 18a, for example) is mounted on the plate of the heat pipe. Minimizing the tolerances of the transistor location is highly desirable for bus bar simplification. The heat pipe plate positions the transistor in a precise, highly repeatable location and permits access from all angles except the surface adjacent the plate.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A system for temperature control of at least one electronic component, the system comprising:

a heat plate supporting the at least one electronic component;

a heat plate temperature sensor for obtaining a heat plate temperature;

an ambient temperature sensor for obtaining an initial ambient temperature;

a fan capable of providing air for cooling the heat plate and the at least one electric component; and a fan control for converting the initial ambient temperature to a reference temperature, comparing the heat plate temperature with the reference temperature, and adjusting the fan speed to drive the heat plate temperature towards the reference temperature.

2. The system of claim 1, wherein the fan comprises a variable speed fan.

3. The system of claim 1, further including a heat pipe assembly having fins, the heat pipe coupled to the heat plate, the fan capable of providing air to the fins.

4. The system of claim 3, wherein the heat pipe comprises a variable conductance heat pipe.

5. The system of claim 4, wherein the heat pipe is capable of compensating for impulse load changes and the fan is capable of compensating for average injected heat changes.

* * * * *

UNITED STATES PATENT AND TRADEMARK OFFICE
CERTIFICATE OF CORRECTION

PATENT NO. : 6,041,850
DATED : March 28, 2000
INVENTOR(S) : Albert A. M. Esser, et al.

It is certified that error appears in the above-identified patent and that said Letters Patent is hereby corrected as shown below:

<u>Title page,</u>
The following names should be deleted:

MELVIN LAVERN HUGHES
HOWARD ROSS EDMUNDS
STEPHEN DANIEL NASH

The correct inventorship on the patent are as follows:

ALBERT ANDREAS MARIA ESSER
JAMES PATRICK LYONS
LYLE THOMAS KEISTER
STEVEN WADE SUTHERLAND
PAUL STEPHEN PATE
PATRICK HENRY MCGINN
CONRAD ANGELO PECILE

Signed and Sealed this

Twenty-first Day of August, 2001

*Attest:*

NICHOLAS P. GODICI
*Attesting Officer*    *Acting Director of the United States Patent and Trademark Office*